United States Patent [19]

Tabara

[11] Patent Number: 5,767,015
[45] Date of Patent: Jun. 16, 1998

US005767015A

[54] METAL PLUG WITH ADHESION LAYER

[75] Inventor: Suguru Tabara, Hamamatsu, Japan

[73] Assignee: Yamaha Corporation, Shizuoka, Japan

[21] Appl. No.: 651,979

[22] Filed: May 21, 1996

[30] Foreign Application Priority Data

May 24, 1995  [JP]  Japan ................................. 7-149456

[51] Int. Cl.$^6$ ................................................. H01L 21/44
[52] U.S. Cl. ........................... 438/654; 438/656; 438/672
[58] Field of Search .................................. 437/192, 195;
                                                     438/654, 656, 672

[56] References Cited

U.S. PATENT DOCUMENTS

| | | | |
|---|---|---|---|
| 4,926,237 | 5/1990 | Sun et al. | 257/764 |
| 5,106,781 | 4/1992 | Penning De Vries | 437/192 |
| 5,326,431 | 7/1994 | Kadomura | 216/49 |
| 5,407,861 | 4/1995 | Marangon et al. | 437/192 |
| 5,529,956 | 6/1996 | Morishita | 437/195 |

OTHER PUBLICATIONS

M. Sato, et al., "Suppression of Microloading Effect by Low-Temperature SiO$_2$ Etching", Jpn. J. Appln. Phys., vol. 31 (1992), pp. 4370–4375.

*Primary Examiner*—John Niebling
*Assistant Examiner*—Brendan Mee

[57] ABSTRACT

After an interconnection layer such as Al alloy is formed on an insulating film covering the surface of a substrate, a connection hole is formed through a laminate of the insulating film and the interconnection layer at the area corresponding to the region to be connected. An adhesion layer such as TiN is formed on the interconnection layer, covering the inner surface of the connection hole, and thereafter a conductive layer such as W is formed on the adhesion layer by blanket CVD, burying the inside of the connection hole. The conductive layer is etched back to leave part of the conductive layer in the connection hole as a plug. Through interconnection patterning, an interconnection having a desired pattern is formed which is constituted by the remaining portions of the interconnection layer, the adhesion layer, and the plug. The adhesion layer functions as an antireflection layer during the interconnection patterning. In the interconnection forming method using blanket CVD, the number of processes can be reduced and the reliability of the interconnection can be improved.

13 Claims, 8 Drawing Sheets

METAL PLUG WITH ADHESION LAYER

BACKGROUND OF THE INVENTION a) Field of the Invention

The present invention relates to a method of forming an interconnection in which a connection hole is buried with a metal plug such as W (tungsten) by blanket CVD (chemical vapor deposition), and more particularly to a technique regarding an interconnection using a metal plug with an adhesion layer, particularly with a TiN adhesion layer.

b) Description of the Related Art

A conventional interconnection forming method using blanket CVD such as illustrated in FIGS. 9 to 13 is known.

As illustrated in FIG. 9, after an n-type impurity doped region 12 to be connected to an interconnection is formed in the surface region of a p-type semiconductor substrate 10 which may be made of Si, an insulating film 14 is formed over the substrate, covering the region 12. A connection hole is formed in the insulating film 14 at the position corresponding to the region 12, and thereafter an adhesion layer 15 is formed on the insulating film 14, covering the inner surface of the connection hole, the adhesion layer 15 being a laminate of a Ti layer and a TiN or TiON layer formed thereon. Thereafter, a W layer 17 is formed on the adhesion layer 15 by blanket CVD, burying the connection hole. The adhesion layer 15 improves adhesion between the W layer 17 and the insulating film 14, and also functions as a barrier layer for preventing a reaction of the W layer 17 with substrate Si.

Next, as illustrated in FIG. 10, the W layer is etched back until the adhesion layer 15 on the top surface of the insulating film 14 is exposed, and part of the W layer 17 is left unetched in the connection hole as a plug 17A.

As illustrated in FIG. 11, an Al alloy layer 19 is formed over the substrate, covering the plug 17A and adhesion layer 15.

As illustrated in FIG. 12, an antireflection layer 21 made of, for example, TiN or TiON, is formed on the Al Alloy layer 19. The antireflection layer 21 suppresses tight reflection from the Al alloy layer 19 during a photolithography process for interconnection patterning. Therefore, a precision of pattern transfer to a resist layer can be improved.

Next, as illustrated in FIG. 13, a laminate of the adhesion layer 15, Al alloy layer 19, and antireflection layer 21 is patterned to form an interconnection 23 having a desired pattern. The interconnection 23 is constituted by a remaining portion 15A of the adhesion layer 15, the plug 17A, a remaining portion 19A of the Al alloy layer 19, and a remaining portion 21A of the antireflection layer 21.

The above conventional technique is, however, associated with the following problems (a) to (f).

(a) As shown in FIG. 14, if the flatness of the insulating film 14 is irregular because of a presence of steps $S_1$ and $S_2$ such as underlying interconnections formed on the surface of the substrate 10, at the etch-back process illustrated in FIG. 10, the over-etch amount is required to be large so as to remove W left at a stepped portion a and in a recess b. The plug 17A is therefore etched excessively in the connection hole.

(b) If the over-etching is insufficient at the etch-back process, portions 17a and 17b of the W layer are left at the stepped portion a and in the recess b as shown in FIG. 15. The patterning process illustrated in FIG. 13 is performed by dry etching with chlorine contained gas and by using a resist layer as a mask. However, dry etching with chlorine gas shows a low W etching rate so that the W layer portions 17a and 17b are difficult to remove. If the W layer portions 17a and 17b are not removed completely, adjacent interconnections may be electrically short-circuited at the later interconnection patterning process. If the over-etch amount of an interconnection is increased to completely remove the W layer portions 17a and 17b, the resist layer on the interconnection may be removed resulting in a possible breakage of the interconnection.

(c) Remaining portions of W such as the W layer portions 17a and 17b may be etched by fluorine containing gas (such as $SF_6$ and $NF_3$). However, it has been found from experiments by the inventor that resist becomes difficult to if the wafer is exposed to plasma of fluorine containing gas after the Al alloy layer 19 is etched. Namely, after W remaining portions are removed with fluorine containing plasma gas, resist cannot be removed completely by a combination of ashing which uses plasma gas mainly containing oxygen and cleaning which uses amine containing organic solvent. The inventor considers this as resulting from non-volatile $AlF_3$. $AlF_3$ is an Al containing byproduct (mainly $AlCl_3$) fluorinated by fluorine radicals, Al having been attached or implanted in the resist surface when Al alloy is etched.

(d) Even if remaining portions of W such as the W layer portions 17a and 17b are completely etched by fluorine containing gas, the TiN layer deposited as the adhesion layer 15 underlies the W layer 17 and this TiN layer is required to be removed. The etching rate of TiN is low if fluorine containing gas is used so that the interconnection etching time becomes long and the productivity is lowered. Even if the TiN layer is etched by changing the etching gas from fluorine containing gas to chlorine containing gas after the W remaining portions are etched with fluorine containing gas, the substantial over-etch amount of the interconnection layer is increased, leaving a possibility of consuming the resist on the interconnection leading to a possible breakage of the interconnection.

(e) Three film forming steps for the adhesion layer 15, Al alloy layer 19, and antireflection layer 21 are required, complicating the manufacture process.

(f) The sandwich structure of Ti/Al/Ti alloys is likely to generate corrosion after the interconnection etching.

SUMMARY OF THE INVENTION

It is an object of the present invention to provide a novel method of manufacturing a semiconductor device with a W plug.

It is another object of the present invention to provide a method of manufacturing a semiconductor device capable of forming a W plug with a fewer number of processes without posing a remaining W problem.

According to one aspect of the present invention, there is provided a method of manufacturing a semiconductor device, comprising the steps of: a) providing a substrate having an insulating layer thereover; b) forming a first conductive layer on the insulating layer; c) forming a connection hole through the first conductive layer and the insulating layer; d) forming an adhesion layer over the connection hole; e) forming a metal plug in the connection hole; and f) patterning a lamination of the adhesive layer and the first conductive layer, wherein a part of the adhesion layer serves as an antireflection layer in selectively removing the first conduction layer.

The adhesion layer is used also as an antireflection layer. Therefore, a dedicated antireflection layer is not necessary in addition to the adhesion layer so that the processes can be simplified.

The laminate etched during interconnection patterning is a two-layer structure including the adhesion layer and the first conductive layers. As compared to a conventional three-layer structure including Ti/Al/Ti alloys, corrosion is hard to be generated after interconnection etching and the reliability of the interconnection can be improved.

If the first conductive layer is made of Al or Al alloy and the metal plug is made of W, portions of remaining W if any on the adhesion layer are removed by dry etching using fluorine containing gas and, thereafter, the interconnection is patterned by selective etching using chlorine containing gas and by using a resist layer as a mask. In this manner, the over-etch amount of W is made small so that the W plug in the connection hole is not excessively etched and a good plug shape can be maintained. Furthermore, since the resist layer is not exposed to fluorine gas plasma in the presence of Al, the resist film is not difficult to remove.

In the technique of manufacturing a semiconductor device with W plugs, the adhesion layer for improving adhesion between the W plug layer and first conductive layer is used also as the antireflection layer during interconnection patterning. Therefore, independent adhesion and antireflection layers are not necessary so that the number of manufacture processes can be reduced.

BRIEF DESCRIPTION OF THE DRAWINGS

FIG. 31B is a schematic cross sectional view of an inductively coupled plasma etcher.

DETAILED DESCRIPTION OF THE PREFERRED EMBODIMENTS

FIGS. 1, 2, 3A, 4 to 7, and 8A to 8C illustrate a method of forming an interconnection according to the embodiment of an invention. The processes (1) to (8) corresponding to these drawings will be described in this order.

Figure 1:
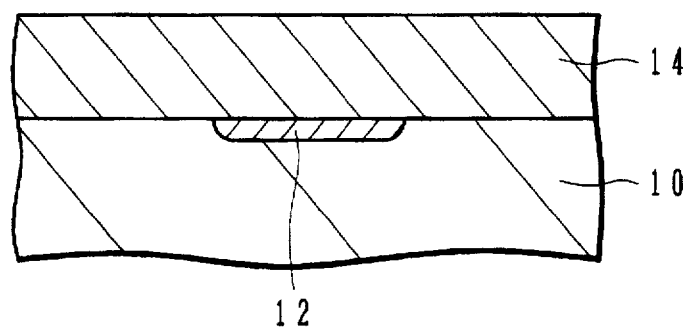
FIGS. 1, 2, 3A, 4 to 7, and 8A to 8C are cross sectional views of a substrate illustrating a process of forming an interconnection according to an embodiment of the invention.

(1) As shown in FIG. 1, in the surface region of a semiconductor substrate 10 made of Si, an $n^+$- or $p^+$-type impurity doped region 12 to be connected to an interconnection is formed by well known selective impurity doping. Thereafter, an insulating film 14 made of, for example, silicon oxide or silicon nitride, is formed on the surface of the substrate.

Figure 2:
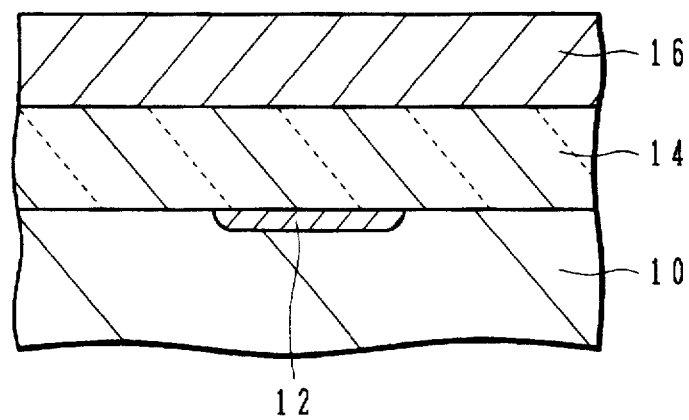

(2) As shown in FIG. 2, an Al alloy layer 16 as a main interconnection layer is formed on the insulating film 14 by sputtering under the following conditions:

A DC magnetron sputtering system is used;
Pressure: 1 to 3 mTorr;
Gas Flow Rate: Ar=50 to 150 sccm;
Power: 6 to 10 kW; and
Substrate Temperature: 100° to 200° C. If necessary, an antireflection layer such as TiN and TiON may be deposited on the Al alloy layer 16. An Al layer may be used instead of the Al alloy layer 16.

Figure 3A:
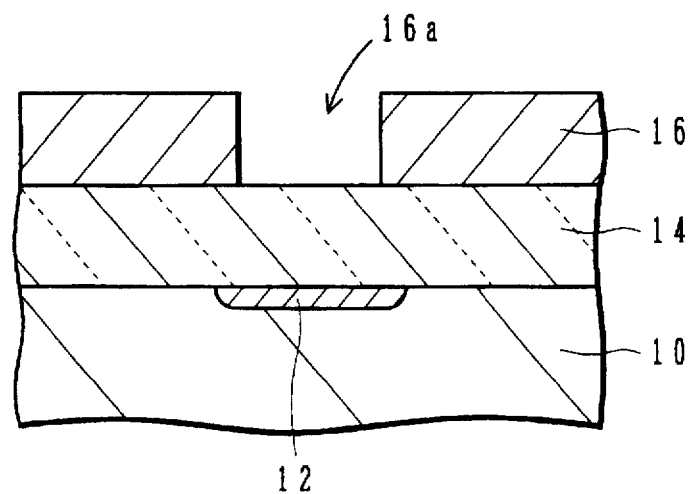

(3) As shown in FIG. 3A, a connection hole 16a is formed in the Al alloy layer 16 by photolithography and dry etching. At the dry etching process, a resist layer (not shown) is used as a mask and chlorine containing gas (e.g., $Cl_2+BCl_3$) is used.

For example, the conditions of etching the Al alloy are selected as follows.

Figure 3B:
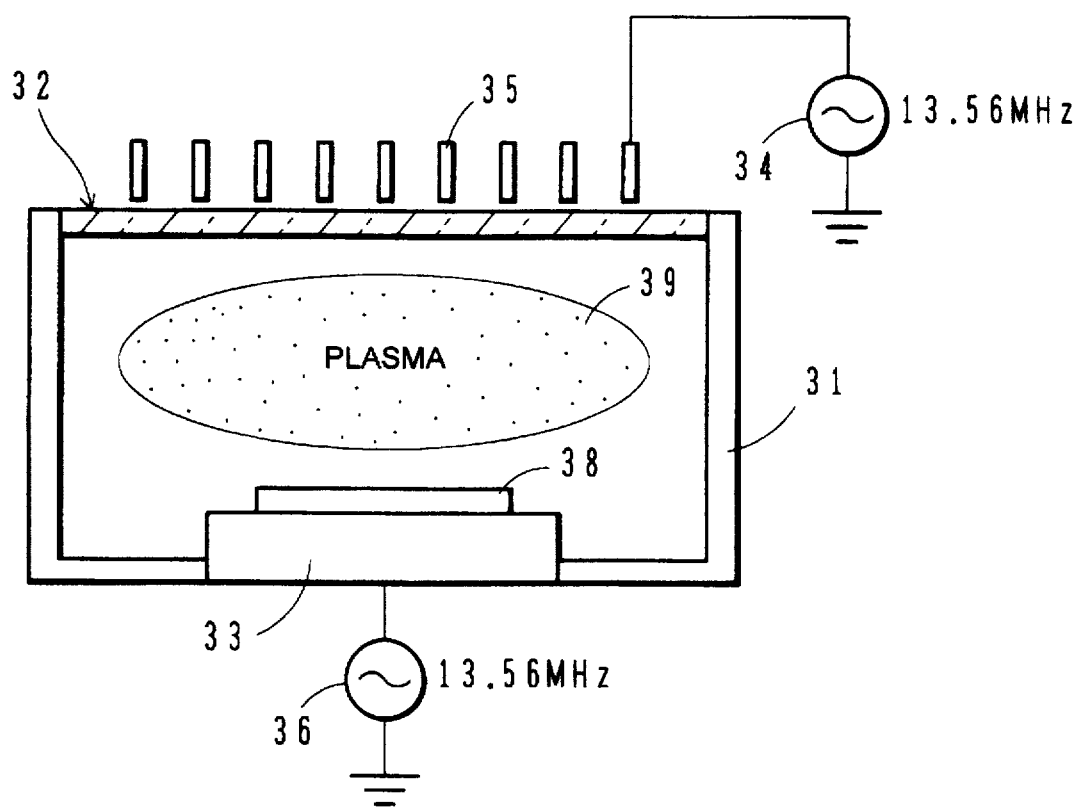

An inductively coupled plasma etcher such as shown in FIG. 3B is used. In FIG. 3B, a vacuum chamber 31 includes a dielectric upper plate 32 made of a dielectric material and a bottom electrode 33 made of a conductive material. Above (out side of) the dielectric upper plate 32, an inductive coil 35 is disposed and connected to an RF source (13.56 MHz) 34. The bottom electrode 33 is connected to another RF source (13.56 MHz) 36, and on (inside of) the bottom electrode 33 a wafer 38 is placed. As gas is introduced into the vacuum chamber 31 and a main RF power and a bias RF power are supplied from the RF sources 34 and 36 to the inductive coil 35 and bottom electrode 33, plasma 39 is generated at the region over the wafer 38.

The other conditions are selected, for example, as follows:

Pressure: 5 to 15 mTorr;
Gas Flow Rate: $Cl_2/BCl_3$=30 to 60/30 to 60 sccm;
Source Power: 300 to 450 W;
Bias Power: 100 to 150 W; and
Bottom Electrode Temperature: 20° to 50° C.

Thereafter, ashing is performed using gas containing mainly oxygen and then a cleaning process is performed using organic solvent, to thereby remove the resist layer.

Figure 4:
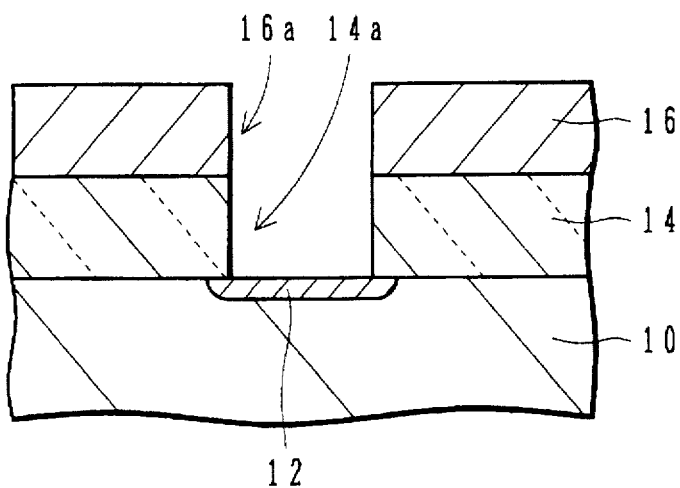

(4) As shown in FIG. 4, by using the Al alloy layer 16 as a mask, a connection hole 14a is formed in the insulating film 14 by selective dry etching. The connection hole 14a is contiguous to the connection hole 16a and reaches the impurity doped region 12. In the dry etching process, fluorine containing gas (e.g., ($CF_4+CHF_3+Ar$) is used. Since Al or Al alloy is not etched by fluorine containing gas, the Al alloy layer 16 can be used as the etching mask. Because the etching mask is the conductive Al alloy layer 16, the etching rate at a small opening can be suppressed from being lowered by charge-up of the mask (microloading effect) (e.g., refer to M. Sato, et al. : Jpn. J. Appl. Phys. Vol. 31 (1992) Part 1. No. 12B).

For example, the conditions of etching the insulating film such as $SiO_2$ are selected as follows:

A magnetron reactive ion etching system is used;
Pressure: 160 mTorr;
Gas Flow Rate: $CF_4/CHF_3/Ar$=5/3/60 sccm;
RF Power: 700 W; and
Magnetic Flux Density: 30 gauss.

If some microloading effect by charge-up at the resist surface can be permitted, the resist layer used in the process of FIG. 3 may not be removed. Then, using a laminate of the resist layer and Al alloy layer 16 as a mask, the connection hole 14a may be formed in the insulating film 14, and thereafter the resist layer is removed.

Figure 5:
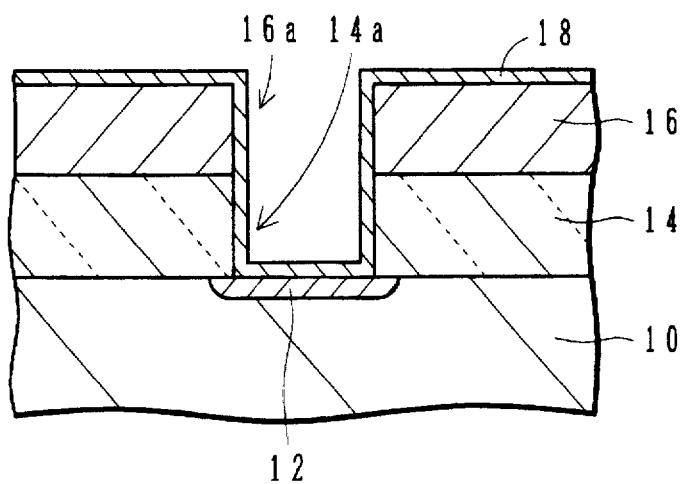

(5) As shown in FIG. 5, a TiN layer 18 is formed on the Al alloy layer 16 by CVD or sputtering, covering the inner surfaces of the connection holes 16a and 14a. The TiN layer 18 serves as both a barrier layer and an adhesion layer. A Ti layer may be formed under the TiN layer 18, instead of the TiN layer 18, other layers such as a TiON layer, a TiW layer, and a WSi layer may be used.

For example, the conditions of forming the Ti(O)N layer are selected as follows:

A DC magnetron sputtering system is used;

Gas: $N_2$ ($O_2$ is also mixed for TiON);
Pressure: 5 to 10 mTorr;
Gas Flow Rate: $N_2$ (+$O_2$)=50 to 100 sccm ($O_2$=0 to 10%);
Power: 6 to 10 kW;
Substrate Temperature: 100° to 200° C.; and
Film Thickness: 50 to 150 nm.

Figure 6:
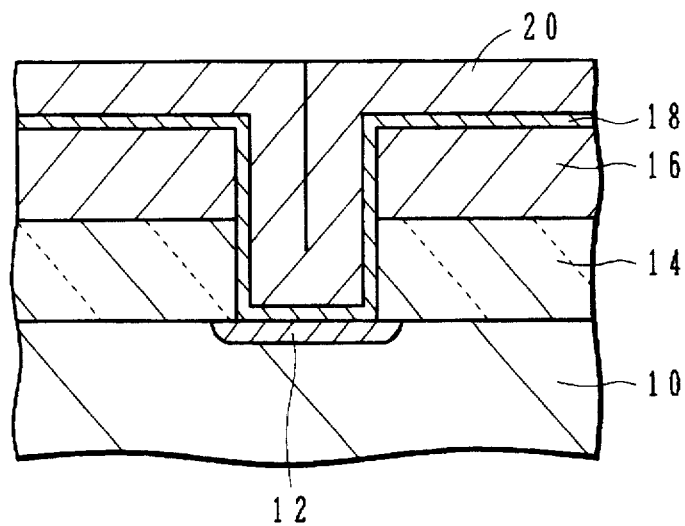

(6) As shown in FIG. 6, a W layer 20 is formed on the TiN layer 18 by blanket CVD, burying the connection holes 16a and 14a.

For example, the conditions of forming the W layer are selected as follows:

After a nucleation process, thermal CVD is performed under the conditions of:
Gas: $WF_6$+$H_2$+$N_2$+Ar;
Pressure: 50 to 100 mTorr;
Wafer Temperature: 450° C.;
Gas Flow Rate: $WF_6$/$H_2$/$N_2$/Ar=60 to 80/400 to 500 /50 to 150/2000 sccm.

Figure 7:
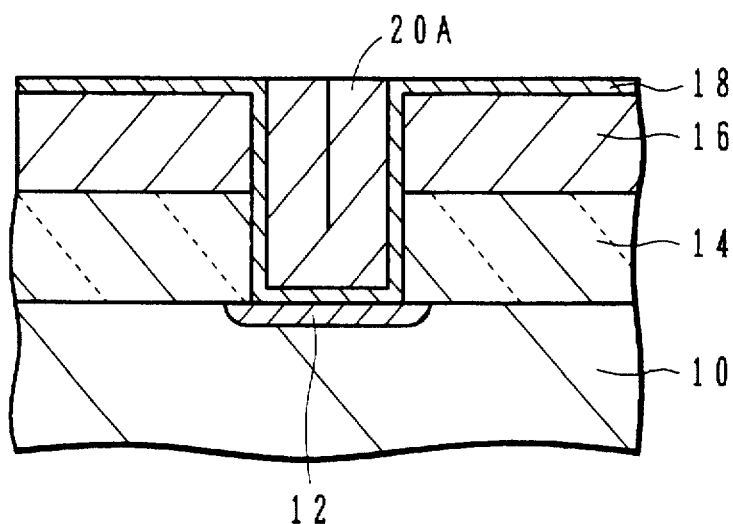

(7) As shown in FIG. 7, the W layer 20 is etched back until the TiN layer 18 on the Al alloy layer 16 is exposed, by using plasma of gas containing mainly fluorine containing gas (e.g., $SF_6$ and $NF_3$). Part of the W layer 20 is left unetched in the connection holes as a plug 20A. The TiN layer 18 on the Al alloy layer 16 is also left unetched.

For example, the W etch-back conditions are selected as follows:

Etch-back is performed by an inductively coupled plasma etcher shown in FIG. 3B;
Pressure: 5 to 20 mTorr;
Gas: $SF_6$/$N_2$;
Flow Rate Ratio: $SF_6$/$N_2$=0.8 to 1.2 total flow rate 100 to 300 sccm:
Source Power: 600 to 700 W;
Bias Power: 60 to 100 W; and
Bottom Electrode Temperature: 20° to 30° C.

Figure 8A:
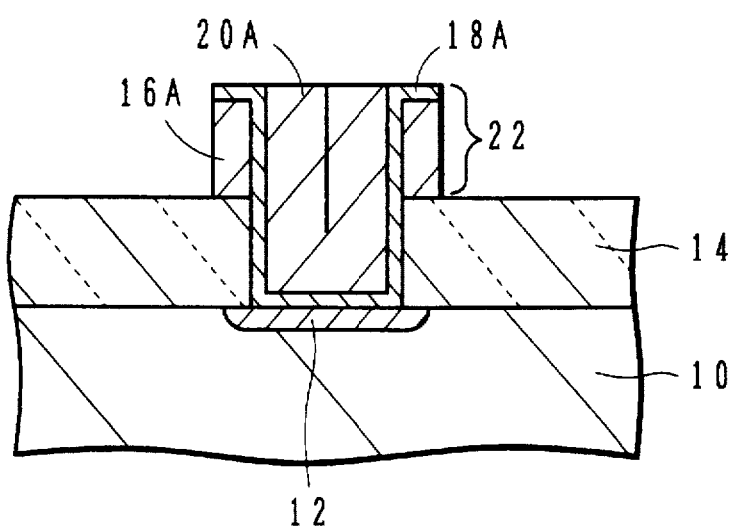

(8) A resist layer (not shown) having a desired wiring pattern is formed on the TiN layer 18 and plug 20A by photolithography. Thereafter, as shown in FIG. 8A, by using the resist layer as a mask, a laminate of the Al alloy layer 16 and TiN layer 18 is patterned by selective dry etching to form an interconnection 22 which is constituted by a remaining portion 16A of the Al alloy 16, a remaining portion 18A of the TiN layer 18, and the plug 10A. Since the insulating film 14 was etched at the process illustrated in FIG. 4 by using the Al alloy layer 16 as the mask, the hole inner wall of the insulating film 14 is self-aligned with the hole inner wall of the Al alloy layer 16A. Namely, the inner periphery of the interconnection 22 is aligned with the inner diameter of the connection hole. Since the interconnection 22 is patterned by the same mask, the outer periphery of the Al alloy layer 16A is aligned with that of the adhesion layer 18A.

The TiN layer 18 functions as an antireflection layer during the photolithography process so that a precision of pattern transfer to the resist layer can be improved. Chlorine containing gas (e.g., $Cl_2$+$BCl_3$) is preferably used for the dry etching process. After this etching, ashing is performed by using gas containing mainly oxygen and cleaning is performed by using organic solvent, to thereby remove the resist film.

Figure 8B:
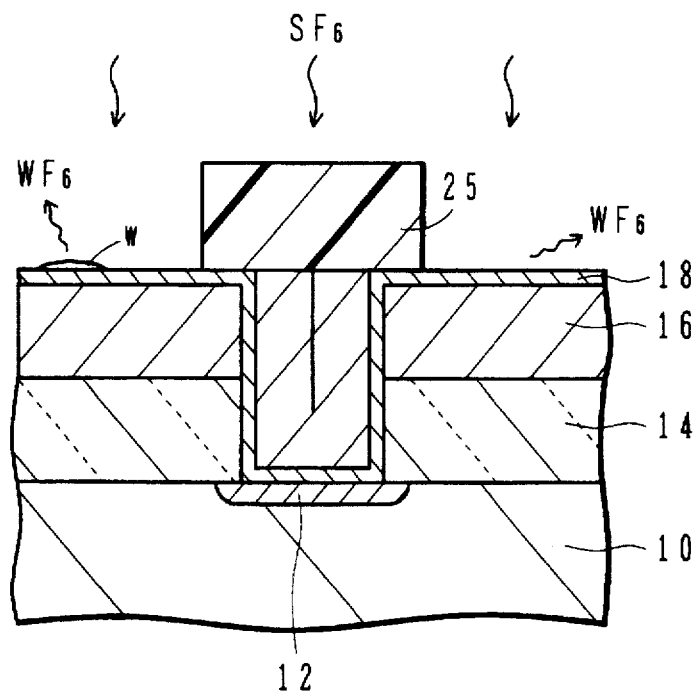
Figure 8C:
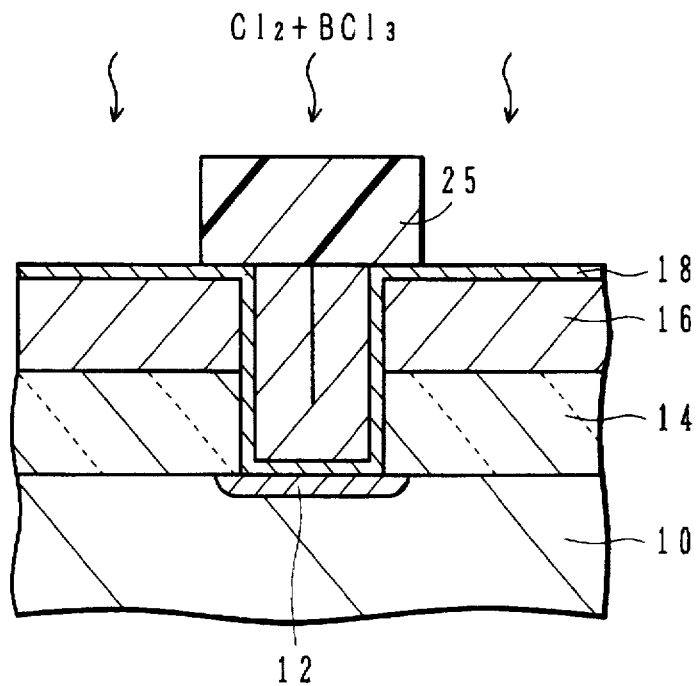
Figure 9:
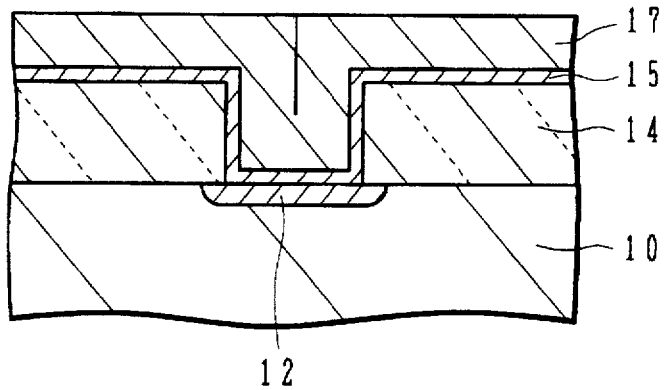
FIGS. 9 to 13 are cross sectional views illustrating a W layer forming process of a conventional interconnection forming method.
Figure 10:
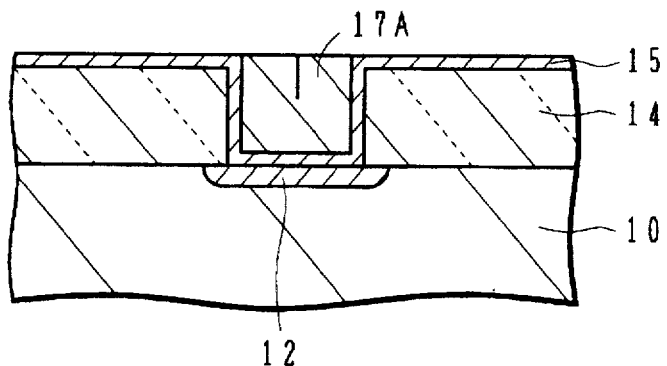
Figure 11:
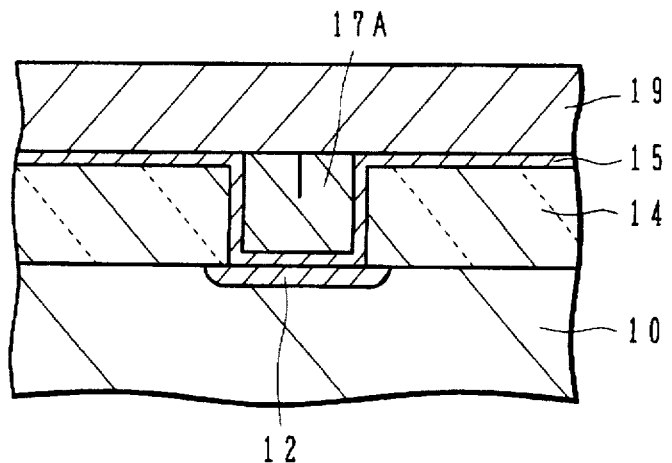
Figure 12:
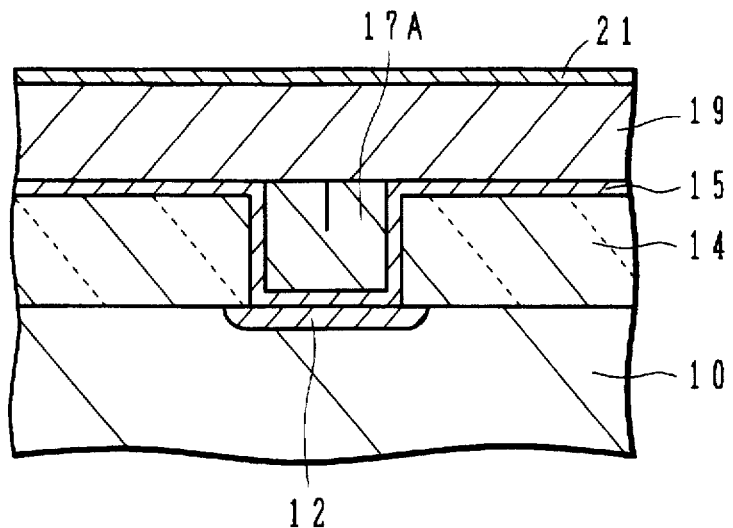
Figure 13:
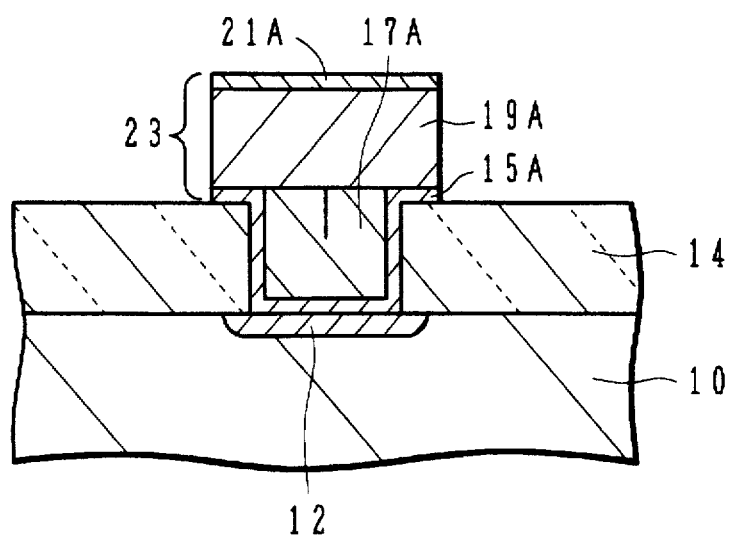
Figure 14:
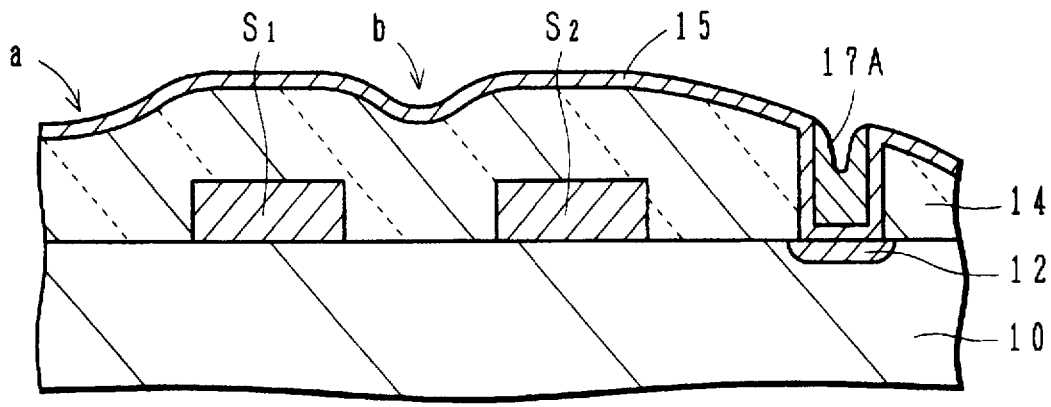
FIG. 14 is a cross sectional view of a substrate illustrating excessive over-etch in the W layer etch-back process.
Figure 15:
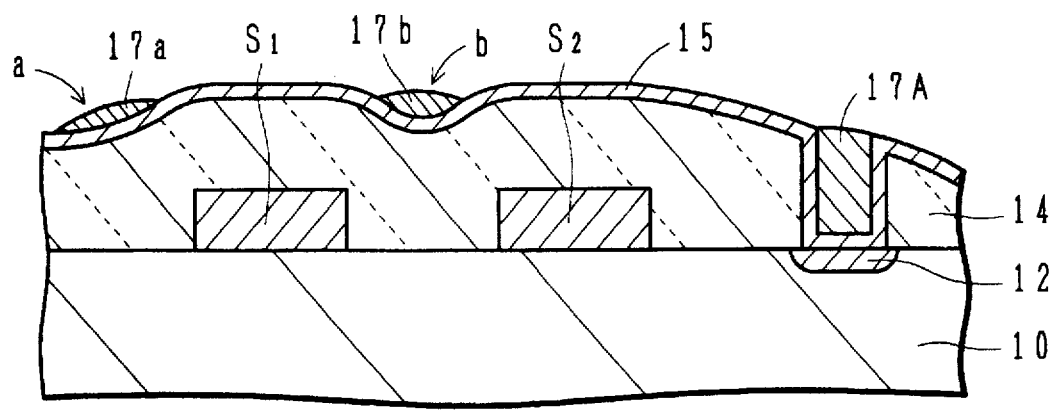
FIG. 15 is a cross sectional view of a substrate illustrating insufficient over-etch in the W layer etch-back process.

If it is likely that some W remaining portions (W residue) such as shown in FIG. 15 are left in the etch-back process illustrated in FIG. 7 because of insufficient flatness of the insulating film 14, these W remaining portions on the TiN layer 18 are preferably removed, as shown in FIG. 8B, by forming a resist layer 25 and prior to the interconnection patterning, performing selective dry etching using fluorine containing gas (e.g., $SF_6$ and $NF_3$) and by using the resist layer 25 as the mask so that W residue can be removed effectively. In this manner, the over-etch amount can be made small so that the plug 20A will not be etched excessively in the etch-back process illustrated in FIG. 7 and a good plug shape can be maintained. As shown in FIG. 8C, after etching the W remaining portions by fluorine containing gas, the gas is changed to chlorine containing gas before the Al alloy layer 16A is exposed to perform the interconnection patterning (laminate etching). In this manner, $AlF_3$ is not formed on the surface of the resist layer 25 so that the resist film can be removed with ease. Further, since the remaining portion 18A made of TiN over the remaining portion 16A made of Al alloy does not need to be removed, over-etch amount is substantially reduced.

In the embodiment described above, the TiN layer 18 functions not only as the barrier and adhesion layers but also as the antireflection layer. Therefore, the processes can be simplified without forming a dedicated antireflection layer. Since the structure of the interconnection is a two-layered structure including the TiN layer 18A and Al alloy layer 16A, corrosion after interconnection etching is hard to be generated as compared to a conventional three-layer structure, thereby allowing high reliability of interconnection.

This invention is not limited to the above embodiment only, but is applicable to a second or higher level interconnection of a multi-layer interconnection. For example, this invention is applicable to a higher level interconnection layer among two level interconnection layers. In this case, a portion of the lower level interconnection layer becomes the region to be connected. Similarly, the invention is applicable to any interconnection layer of a three-layer interconnection. In addition to an aluminum alloy, the main interconnection layer may be made of refractory metal such as W, Mo, Ta, and Ti, silicide thereof, and Cu. Other materials may also be used as the main interconnection layer if they have a function of lowering the total resistance of an interconnection.

The present invention has been described in connection with the preferred embodiments. It is apparent to those skilled in the art that various modifications, improvements, combinations and the like can be made without departing from the scope of the appended claims.

We claim:

1. A method of manufacturing a semiconductor device, comprising the steps of:
   a) providing a substrate having an insulating layer thereover;
   b) forming a first conductive layer on the insulating layer;
   c) forming a connection hole through the first conductive layer and the insulating layer;
   d) forming an adhesion layer over the connection hole;
   e) forming a metal plug in the connection hole; and
   f) patterning a lamination of the adhesion layer and the first conductive layer, wherein a part of the adhesion layer serves as an antireflection layer.

2. A method according to claim 1, wherein the first conductive layer comprises a material selected from a group consisting of aluminum, aluminum alloy, Cu, a refractory metal consisting of one of W, Mo, Ta, and Ti, and a silicide of the refractory metal.

3. A method according to claim 1, wherein the adhesion layer comprises a material selected from a group consisting of TiN and TiON.

4. A method according to claim 1, wherein the plug is made of tungsten.

5. A method according to claim 1, wherein the step (e) comprises the steps of:
- (e-1) forming a blanket tungsten layer over the connection hole; and
- (e-2) removing the blanket tungsten layer until the adhesion layer is exposed to form a tungsten plug.

6. A method according to claim 1, wherein the step (f) comprises the steps of:
- (f-1) forming a resist pattern on the adhesion layer and the plug;
- (f-2) excessively etching remaining tungsten from a surface of the adhesion layer; and
- (f-3) selectively removing the adhesion layer and the conductive layer.

7. A method according to claim 1, wherein the connection hole reaches a surface of the substrate.

8. A method of manufacturing a semiconductor device, comprising the steps of:
- a) providing a substrate having an insulating layer thereover;
- b) forming a conductive layer on the insulating layer;
- c) forming a connection hole through the insulating layer and the conductive layer;
- d) forming an adhesion layer over the connection hole;
- e) forming a blanket tungsten layer over the connection hole and the adhesion layer;
- f) selectively removing the blanket tungsten layer until a surface of the adhesion layer is exposed to form a tungsten plug; and
- g) patterning the adhesion layer and the conductive layer, wherein the exposed adhesion layer serves as an anti-reflection layer.

9. A method according to claim 8, wherein the conductive layer comprises a conductive material selected from a group consisting of aluminum, aluminum alloy, Cu, refractory metal including W, Mo, Ta, and Ti, and silicide thereof.

10. A method according to claim 8, wherein the adhesion layer comprises a material selected from a group consisting of TiN and TiON.

11. A method according to claim 8, wherein the step (e) comprises the steps of:
- (e-1) forming a blanket tungsten layer over the connection hole; and
- (e-2) removing the blanket tungsten layer until the adhesion layer is exposed to form a tungsten plug.

12. A method according to claim 8, wherein the step (f) comprises the steps of:
- (f-1) forming a resist pattern on the adhesion layer and the plug;
- (f-2) excessively etching remaining tungsten from a surface of the adhesion layer; and
- (f-3) selectively removing the adhesion layer and the conductive layer.

13. A method according to claim 8, wherein the connection hole reaches a surface of the substrate.

* * * * *